(12) United States Patent
Chang et al.

(10) Patent No.: US 8,410,823 B2
(45) Date of Patent: Apr. 2, 2013

(54) METHOD AND SYSTEM FOR AN LC RESONANT CURRENT GAIN BOOSTING AMPLIFIER

(75) Inventors: Yuyu Chang, Irvine, CA (US); Meng-An Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1415 days.

(21) Appl. No.: 11/619,803

(22) Filed: Jan. 4, 2007

(65) Prior Publication Data

US 2008/0136463 A1 Jun. 12, 2008

Related U.S. Application Data

(60) Provisional application No. 60/868,818, filed on Dec. 6, 2006.

(51) Int. Cl.
*H02M 11/00* (2006.01)
*H03F 3/45* (2006.01)

(52) U.S. Cl. .......................................... 327/103; 327/100
(58) Field of Classification Search ................... 327/103
See application file for complete search history.

(56) References Cited

U.S. PATENT DOCUMENTS 6,181,120 B1 * 1/2001 Hawkes et al. ............... 323/282
2006/0220743 A1 * 10/2006 Kojima .......................... 330/283

* cited by examiner

*Primary Examiner* — Lincoln Donovan
*Assistant Examiner* — Diana J Cheng
(74) *Attorney, Agent, or Firm* — Thomas|Horstemeyer, LLP.

(57) ABSTRACT

Aspects of a method and system for an integrated LC resonant current gain boosting amplifier may include amplifying within a chip, via an on-chip LC current gain circuit, an alternating current (AC) generated by an on-chip voltage-to-current converter, and converting within the chip, via an on-chip current-to-voltage circuit; the amplified alternating current to an output voltage. The on-chip LC current gain circuit comprises only passive components, which may include one or more resistors, one or more capacitors, and one or more inductors.

21 Claims, 3 Drawing Sheets

METHOD AND SYSTEM FOR AN LC RESONANT CURRENT GAIN BOOSTING AMPLIFIER

CROSS-REFERENCE TO RELATED APPLICATIONS/INCORPORATION BY REFERENCE

This application makes reference to, claims priority to, and claims the benefit of U.S. Provisional Application Ser. No. 60/868,818, filed on Dec. 6, 2006.

The above stated application is hereby incorporated herein by reference in its entirety.

FIELD OF THE INVENTION

Certain embodiments of the invention relate to electronic circuit design. More specifically, certain embodiments of the invention relate to a method and system for an integrated LC resonant current gain boosting amplifier.

BACKGROUND OF THE INVENTION

Many complex electronic circuits require various amplifier stages for a wide variety of applications. In many cases, it may be desirable to convert an input voltage to a current and then amplify the current before converting the current back to a voltage. This conversion from a voltage to a current at the input of the amplifier circuit permits the use of current mirrors.

A current mirror is a device comprising an input, an output and a common terminal that is typically connected to a power supply. The input may be connected to a current source. Ideally, the output current will then be equal to the input current and therefore the output is said to mirror the input current, thence the name. By varying the device properties, the mirror current may also be an amplified copy of the input reference current. This should ideally be true for varying loads at the output.

The use of current mirrors may frequently lead to decreased sensitivity to variations of parameters such as temperature or voltage supply. When the bias currents are small, it is often more economical to use current mirrors rather than resistors in order to save die area. Current mirrors comprised of active electronic circuit elements have been used extensively in analog electronic integrated circuits both as biasing elements and as load devices for amplifier stages. After the current mirror, the output current may be converted back to a voltage by means of a transimpedance amplifier.

In modern integrated circuit design, current mirrors are often designed using Metal-Oxide Semiconductor Field Effect Transistors (MOSFETs) or, less frequently, bipolar transistors. However, due to these active elements, the current mirror requires DC biasing power beyond what is required by the voltage-to-current and the current-to-voltage converters. The biasing power required by the current mirror may be significant and degrade the energy efficiency of the overall amplifier. The energy efficiency in integrated circuits in general, and for applications in portable electronics in particular, is of great importance. Energy efficiency directly impacts the battery lifetime of devices and heat dissipation may become a problem.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for an integrated LC resonant current gain boosting amplifier, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for an integrated LC resonant current gain boosting amplifier. Aspects of a method in accordance with an embodiment of the invention may comprise amplifying within a chip, via an on-chip LC current gain circuit, an alternating current (AC) generated by an on-chip voltage-to-current converter, and converting within the chip, via an on-chip current-to-voltage circuit, the amplified alternating current to an output voltage. The on-chip LC current gain circuit comprises only passive components, which may include one or more resistors, one or more capacitors, and one or more inductors. The on-chip voltage-to-current converter may comprise a transconductance stage, and the on-chip current-to-voltage converter may comprise a transimpedance amplifier.

Figure 1A:
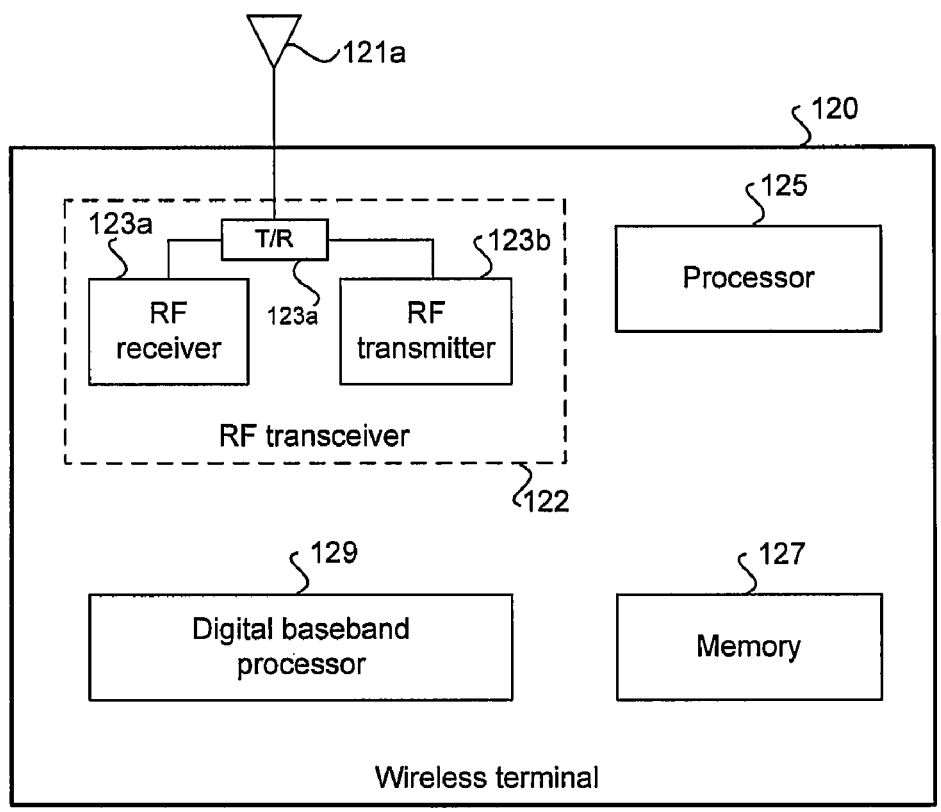
FIG. 1a is a block diagram illustrating an exemplary wireless terminal, in accordance with an embodiment of the invention.

FIG. 1a is a block diagram illustrating an exemplary wireless terminal, in accordance with an embodiment of the invention. Referring to FIG. 1a, there is shown a wireless terminal 120 that may comprise an RF receiver 123a, an RF transmitter 123b, a digital baseband processor 129, a processor 125, and a memory 127. In some embodiments of the invention, the RF receiver 123a and the RF transmitter 123b may be integrated within an RF transceiver 122, for example. A single transmit and receive antenna 121a may be communicatively coupled to the RF receiver 123a and the RF transmitter 123b. A switch or other device having switching capabilities may be coupled between the RF receiver 123a and RF transmitter 123b, and may be utilized to switch the antenna between transmit and receive functions. The wireless terminal 120 may be operated in a system, such as the Wireless Local Area Network (WLAN), a cellular network and/or digital video broadcast network, for example. In this regard, the wireless terminal 120 may support a plurality of wireless communication protocols, including the IEEE 802.11n standard specifications for WLAN networks.

The RF receiver 123a may comprise suitable logic, circuitry, and/or code that may enable processing of received RF signals. The RF receiver 123a may enable receiving RF signals in a plurality of frequency bands in accordance with the wireless communications protocols that may be supported by the wireless terminal 120. Each frequency band supported by the RF receiver 123a may have a corresponding front-end circuit for handling low noise amplification and down conversion operations, for example. In this regard, the RF receiver 123a may be referred to as a multi-band receiver when it supports more than one frequency band. In another embodiment of the invention, the wireless terminal 120 may comprise more than one RF receiver 123a, wherein each of the RF receiver 123a may be a single-band or a multi-band receiver. The RF receiver 123a may be implemented on a chip. In an embodiment of the invention, the RF receiver 123a may be integrated with the RF transmitter 123b on a chip to comprise the RF transceiver 122, for example. In another embodiment of the invention, the RF receiver 123a may be integrated on a chip with more than one component in the wireless terminal 120.

The RF receiver 123a may quadrature down convert the received RF signal to a baseband frequency signal that comprises an in-phase (I) component and a quadrature (Q) component. The RF receiver 123a may perform direct down conversion of the received RF signal to a baseband frequency signal, for example. In some instances, the RF receiver 123a may enable analog-to-digital conversion of the baseband signal components before transferring the components to the digital baseband processor 129. In other instances, the RF receiver 123a may transfer the baseband signal components in analog form.

The digital baseband processor 129 may comprise suitable logic, circuitry, and/or code that may enable processing and/or handling of baseband frequency signals. In this regard, the digital baseband processor 129 may process or handle signals received from the RF receiver 123a and/or signals to be transferred to the RF transmitter 123b, when the RF transmitter 123b is present, for transmission to the network. The digital baseband processor 129 may also provide control and/or feedback information to the RF receiver 123a and to the RF transmitter 123b based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission to the network. In an embodiment of the invention, the digital baseband processor 129 may be integrated on a chip with more than one component in the wireless terminal 120.

The RF transmitter 123b may comprise suitable logic, circuitry, and/or code that may enable processing of RF signals for transmission. The RF transmitter 123b may enable transmission of RF signals in a plurality of frequency bands. Each frequency band supported by the RF transmitter 123b may have a corresponding front-end circuit for handling amplification and up conversion operations, for example. In this regard, the RF transmitter 123b may be referred to as a multi-band transmitter when it supports more than one frequency band. In another embodiment of the invention, the wireless terminal 120 may comprise more than one RF transmitter 123b, wherein each of the RF transmitter 123b may be a single-band or a multi-band transmitter. The RF transmitter 123b may be implemented on a chip. In an embodiment of the invention, the RF transmitter 123b may be integrated with the RF receiver 123a on a chip to comprise the RF transceiver 122, for example. In another embodiment of the invention, the RF transmitter 123b may be integrated on a chip with more than one component in the wireless terminal 120.

The RF transmitter 123b may quadrature up convert the baseband frequency signal comprising I/Q components to an RF signal. The RF transmitter 123b may perform direct up conversion of the baseband frequency signal to a baseband frequency signal, for example. In some instances, the RF transmitter 123b may enable digital-to-analog conversion of the baseband signal components received from the digital baseband processor 129 before up conversion. In other instances, the RF transmitter 123b may receive baseband signal components in analog form.

The processor 125 may comprise suitable logic, circuitry, and/or code that may enable control and/or data processing operations for the wireless terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the wireless terminal 120. The processor 125 may also enable executing of applications that may be utilized by the wireless terminal 120. For example, the processor 125 may generate at least one control signal and/or may execute applications that may enable current and proposed WLAN communications in the wireless terminal 120.

The memory 127 may comprise suitable logic, circuitry, and/or code that may enable storage of data and/or other information utilized by the wireless terminal 120. For example, the memory 127 may be utilized for storing processed data generated by the digital baseband processor 129 and/or the processor 125. The memory 127 may also be utilized to store information, such as configuration information, that may be utilized to control the operation of at least one block in the wireless terminal 120. For example, the memory 127 may comprise information necessary to configure the RF receiver 123a for receiving WLAN signals in the appropriate frequency band.

Figure 1B:
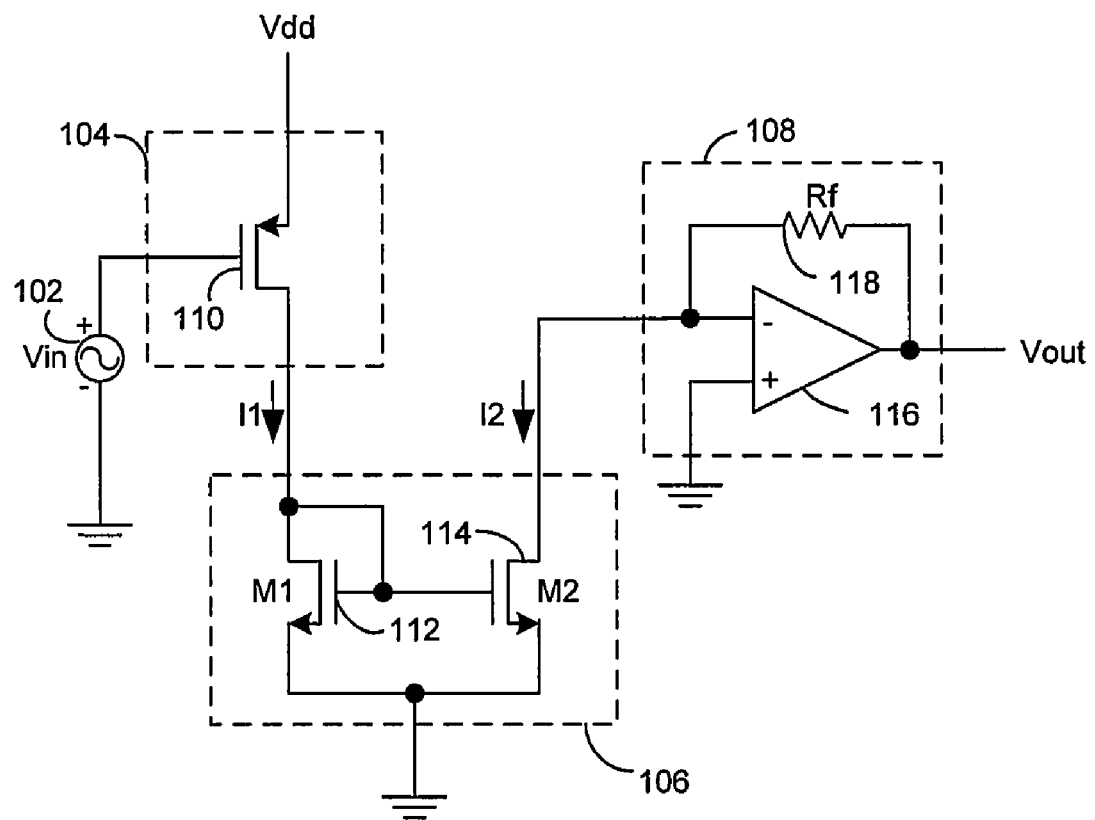
FIG. 1b is a diagram illustrating an exemplary amplifier configuration in connection with an embodiment of the invention.

FIG. 1b is a diagram illustrating an exemplary amplifier configuration in connection with an embodiment of the invention. Referring to FIG. 1b, there is shown a voltage source 102, a voltage-to-current converter 104, a current mirror 106 and a current-to-voltage converter 108. The voltage-to-current converter 104 may comprise a MOSFET 110. The current mirror 106 may comprise MOSFET M1 112 and MOSFET M2 114. The current-to-voltage converter 108 may comprise an amplifier 116 and a resistor Rf 118. There is also shown in FIG. 1b, voltages Vin and Vout, and currents I1 and I2. The amplifier of FIG. 1b may be part of the RF transmitter 123b of FIG. 1a.

The input voltage Vin 102 may represent an input voltage signal to be amplified. By applying the voltage Vin 102 to the voltage-to-current converter 104, a current I1, proportional to the voltage Vin 102 will flow. Hence, the MOSFET 110 may act as an exemplary Gm-stage, where Gm represents transconductance.

The current I1 may be amplified in the exemplary current mirror 106. The current amplification may be controlled by the configuration of the MOSFET M1 112 and MOSFET M2 114. The current amplification that may be obtained may be expressed by the following relationship as:

$$I2 = \frac{W2}{W1} I1$$

where W2 and W1 are the gate width of MOSFET M2 114 and MOSFET M1 112, respectively. The gate length of MOSFET M1 112 and MOSFET M2 114 may be assumed equal. For high frequencies, the above relationship may become less accurate as the gate leakage currents of MOSFET M1 112 and MOSFET M2 114 increase.

An exemplary current-to-voltage converter 108 may be implemented with a transimpedance amplifier configuration as illustrated in FIG. 1b. The output voltage Vout obtained may be proportional to the current I2 and is given by the following relationship:

$$V\text{out}=I2 \cdot Rf$$

where Rf may be the resistance value of resistor Rf 118.

The overall voltage amplification of the exemplary circuit in FIG. 1b, may be given by the following relationship:

$$\frac{V\text{out}}{V\text{in}} = \frac{Gm \cdot W2 \cdot Rf}{W1}$$

where Gm may be the transconductance of the voltage-to-current converter 104. Note that the exemplary configuration shown in FIG. 1b may require active components in the form of MOSFET M1 112 and MOSFET M2 114 to provide a current gain in the current mirror 106.

Figure 2:
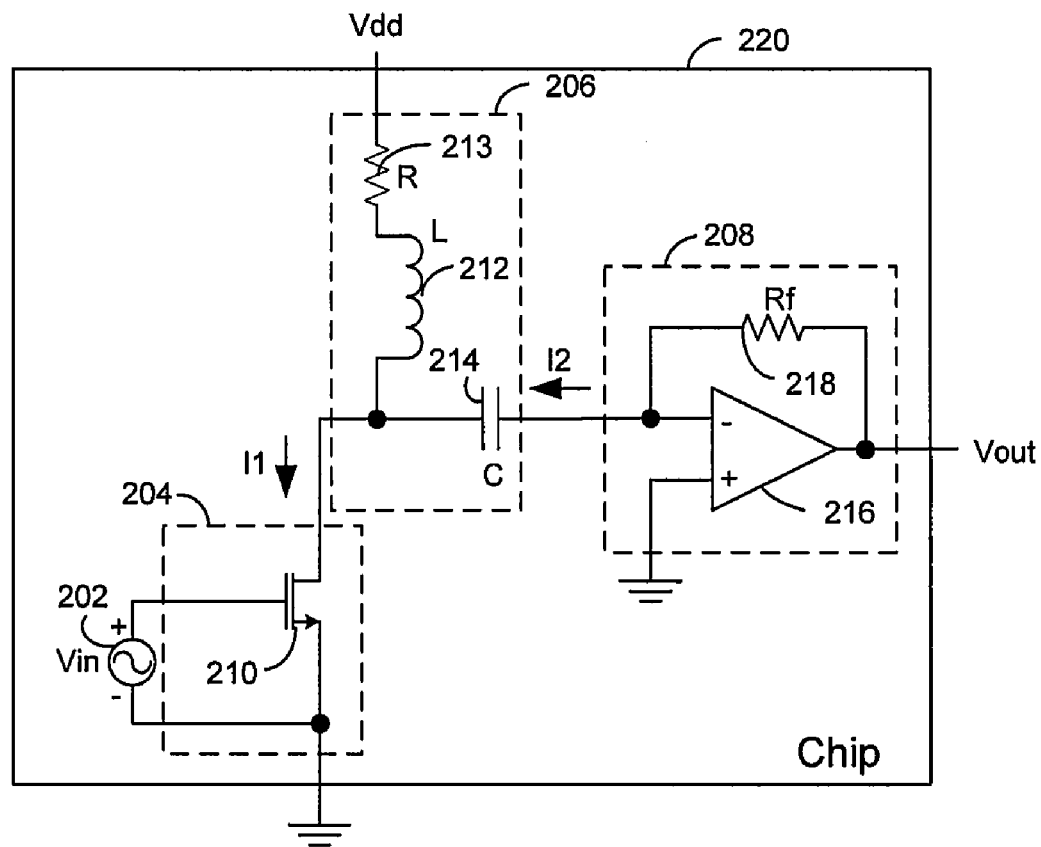
FIG. 2 is a circuit diagram illustrating an exemplary amplifier structure with an integrated LC resonant gain circuit, in accordance with an embodiment of the invention.

FIG. 2 is a circuit diagram illustrating an exemplary amplifier structure with an integrated LC resonant gain circuit, in accordance with an embodiment of the invention. Referring to FIG. 2, there is shown a voltage source Vin 202, a voltage-to-current converter 204, an LC current gain circuit 206 and a current-to-voltage converter 208. The voltage-to-current converter 204 may comprise of a MOSFET 210. The LC current gain circuit 206 may comprise of an inductor L 212, a resistor R 213 and a capacitor C 214. The current-to-voltage converter 208 may comprise an amplifier 216 and a resistor Rf 218. There is further shown in FIG. 2, currents I1 and I2, and voltages Vin and Vout. The amplifier of FIG. 2 may be part of the RF receiver 123a of FIG. 1.

One terminal of the voltage source Vin 202 may be coupled to ground. The other terminal of the voltage source Vin 202 may be coupled to the gate of the MOSFET 210. The source of the MOSFET 210 may be coupled to ground and the drain of the MOSFET 210 may be coupled to one of the terminals of the inductor L 212. The other terminal of the inductor L 212 may be coupled to one terminal of the resistor R 213. The other terminal of the resistor R 213 may be coupled to the supply voltage Vdd. One terminal of the capacitor C 214 may be coupled to the drain of the MOSFET 210. The other terminal of the capacitor C 214 may be coupled to the inverting input of the amplifier 216. The non-inverting input to the amplifier 216 may be coupled to ground. One of the terminals of the resistor Rf 218 may be coupled to the output of the amplifier 216, while the other terminal of the resistor Rf 218 may be coupled to the inverting input of the amplifier 216.

The input voltage Vin 202 may represent an input voltage signal to be amplified. By applying the voltage Vin 202 to the voltage-to-current converter 204, a current I1, proportional to the voltage Vin 202 will flow. Hence, the MOSFET 210 may act as an exemplary Gm-stage, where Gm may stand for transconductance.

The LC current gain circuit 206 may have bandpass filtering properties, where the filter resonance angular frequency ω0 is defined through the following relationship:

$$\omega 0 = \frac{1}{\sqrt{LC}}$$

where L may represent an inductance value of the inductor L 212 and C may represent a capacitance value of capacitor C 214.

The current gain that may be obtained by the LC current gain circuit 206 may be frequency dependent and may achieve a maximum Q=I2/I1 when the input current I1 resonates at approximately the angular frequency ω0. Q may be named after the quality factor of the LC current gain circuit 206. The LC current gain circuit 206 may also be referred to as an LC tank circuit. The quality factor may be expressed as:

$$Q = \frac{1}{R}\sqrt{\frac{L}{C}}$$

when the current I1 resonates at approximately the angular frequency ω0. R may represent the resistance of resistor R 213. R may be representative of either an actual resistor or a parasitic resistance of the inductor L 212. The capacitor C may have some parasitic resistance, so the final tank Q calculation may incorporate this limited capacitor Q. Therefore, maximizing tank Q may be achieved by both maximizing inductor and capacitor Qs for a given operating frequency.

An exemplary current-to-voltage converter 208 may be implemented with a transimpedance amplifier configuration as illustrated in FIG. 2. The output voltage Vout obtained may be proportional to the current I2 and may be given by the following relationship:

$$V\text{out}=I2 \cdot Rf$$

where Rf may be the resistance value of resistor Rf 218.

The overall circuit voltage amplification may hence be expressed as:

$$\frac{V\text{out}}{V\text{in}} = Gm(\omega) \cdot Q(\omega) \cdot Rf$$

where Gm(ω) and Q(ω) may emphasize that the transconductance Gm value and the quality factor Q value are dependent on the angular frequency ω and a maximum is reached at ω=ω0.

Utilizing an exemplary embodiment of the invention as illustrated in FIG. 2, may achieve current amplification without active circuit elements in the LC current gain circuit 206. This may be particularly advantageous because the absence of active elements, for example bipolar transistors or MOSFETs, in the LC current gain circuit 206 may reduce the DC power consumption.

In accordance with an embodiment of the invention, a method and system for an integrated LC resonant current gain boosting amplifier may comprise amplifying within a chip 220, via an on-chip LC current gain circuit 206, an alternating current (AC) I1 generated by an on-chip voltage-to-current converter 204. The invention may further comprise converting within the chip 220, via an on-chip current-to-voltage circuit 208; the amplified alternating current to an output voltage Vout. The on-chip LC gain circuit 206 may cause amplification of the alternating current (AC) generated by an on-chip voltage-to-current converter 204. The on-chip LC current gain circuit 206 comprises only passive components, which may include one or more resistors 213, one or more capacitors 214, and one or more inductors 212. The on-chip voltage-to-current converter 204 may comprise a transconductance stage, and the on-chip current-to-voltage converter 208 may comprise a transimpedance amplifier. The one or more resistors 213, one or more capacitors 214, and one or more inductors 212 have values that cause the amplification of the alternating current (AC) generated by an on-chip voltage-to-current converter 204.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals in electronic circuits, the method comprising:
    amplifying within a chip, via an on-chip LC current gain circuit, an alternating current (AC) generated by an on-chip voltage-to-current converter; and
    converting within said chip, via an on-chip current-to-voltage circuit; said amplified alternating current to an output voltage.

2. The method according to claim 1, wherein said on-chip LC current gain circuit comprises only passive components.

3. The method according to claim 2, wherein said passive components comprise one or more resistors, one or more capacitors, and one or more inductors.

4. The method according to claim 3, wherein said one or more resistors, one or more capacitors, and one or more inductors have values that cause said amplification of said AC generated by said on-chip voltage-to-current converter.

5. The method according to claim 1, wherein said on-chip voltage-to-current converter comprises a transconductance stage.

6. The method according to claim 1, wherein said on-chip current-to-voltage converter comprises a transimpedance amplifier.

7. The method according to claim 1, wherein said on-chip LC current gain circuit resonates at a frequency that causes said amplification of said AC generated by said on-chip voltage-to-current converter.

8. A system for processing signals in electronic circuits, the system comprising:
    an on-chip LC current gain circuit that amplifies within said chip, an alternating current (AC) generated by an on-chip voltage-to-current converter; and
    an on-chip current-to-voltage circuit that converts within said chip, said amplified alternating current to an output voltage.

9. The system according to claim 8, wherein said on-chip LC current gain circuit comprises only passive components.

10. The system according to claim 9, wherein said passive components comprise one or more resistors, one or more capacitors, and one or more inductors.

11. The system according to claim 10, wherein said one or more resistors, one or more capacitors, and one or more inductors have values that cause said amplification of said AC generated by said on-chip voltage-to-current converter.

12. The system, according to claim 8, wherein said on-chip voltage-to-current converter comprises a transconductance stage.

13. The system according to claim 8, wherein said on-chip current-to-voltage converter comprises a transimpedance amplifier.

14. The system according to claim 8, wherein said on-chip LC current gain circuit resonates at a frequency that causes said amplification of said AC generated by said on-chip voltage-to-current converter.

15. A system for processing signals in electronic circuits, the system comprising:
    a voltage-to-current converter integrated on a chip;
    an LC current gain circuit integrated on said chip, which is coupled to said on-chip voltage-to-current converter; and
    a current-to-voltage circuit integrated on said chip, which is coupled to said on-chip LC current gain circuit, wherein said on-chip LC current gain circuit resonates so as to amplify an alternating current (AC) generated by said on-chip voltage-to-current converter.

16. The system according to claim 15, wherein said on-chip current-to-voltage circuit converts within said chip, said amplified alternating current to an output voltage.

17. The system according to claim 15, wherein said on-chip LC current gain circuit comprises only passive components.

18. The system according to claim 17, wherein said passive components comprise one or more resistors, one or more capacitors, and one or more inductors.

19. The system according to claim 18, wherein said one or more resistors, one or more capacitors, and one or more inductors have values that cause said amplification of said AC generated by said on-chip voltage-to-current converter.

20. The system, according to claim 15, wherein said on-chip voltage-to-current converter comprises a transconductance stage.

21. The system according to claim 15, wherein said on-chip current-to-voltage converter comprises a transimpedance amplifier.

* * * * *